(12) United States Patent
Laaser

(10) Patent No.: US 7,852,135 B2
(45) Date of Patent: Dec. 14, 2010

(54) CIRCUIT ARRANGEMENT FOR SIGNAL MIXING

(75) Inventor: Peter Laaser, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/200,262

(22) Filed: Aug. 28, 2008

(65) Prior Publication Data

US 2009/0058495 A1    Mar. 5, 2009

(30) Foreign Application Priority Data

Aug. 29, 2007   (DE) .................. 10 2007 040 867

(51) Int. Cl.
   *G06G 7/12* (2006.01)
(52) U.S. Cl. .................. 327/355; 327/356; 327/361; 455/323; 455/326; 455/333
(58) Field of Classification Search ......... 327/355–361; 455/323, 326, 333
   See application file for complete search history.

(56) References Cited

U.S. PATENT DOCUMENTS 6,531,920 B1 *   3/2003   Ishihara ............... 330/254

7,107,025 B2 *   9/2006   Khorram ............... 455/118
7,417,415 B2 *   8/2008   Yen et al. .............. 323/316

FOREIGN PATENT DOCUMENTS

WO    2006061204 A1    6/2006

OTHER PUBLICATIONS

"RF Microelectronics", Behzad Razavi, University of California, Prentice Hall PTR.
"A 0.25um CMOS Downconverter Mixer for 1.6GHz", F. J. Antunes, et al., Institute of Information Technology and Systems Eng., Federal University of Itajuba, Itajuba, Brazil.

* cited by examiner

*Primary Examiner*—Lincoln Donovan
*Assistant Examiner*—Shikha Goyal
(74) *Attorney, Agent, or Firm*—Dicke, Billig & Czaja, PLLC

(57) ABSTRACT

A circuit arrangement for signal mixing. One embodiment provides a circuit arrangement for mixing an input signal with at least one carrier signal. The circuit arrangement includes a current source and a current sink. The current source and the current sink have a mixer core coupled between them which provides cross-coupling between mixer input connections and mixer output connections.

25 Claims, 4 Drawing Sheets

CIRCUIT ARRANGEMENT FOR SIGNAL MIXING

CROSS-REFERENCE TO RELATED APPLICATIONS

This Utility patent application claims priority to German Patent Application No. DE 10 2007 040 867.8 filed on Aug. 29, 2007, which is incorporated herein by reference.

BACKGROUND

The present invention relates to a circuit arrangement for signal mixing, and relates particularly to a circuit arrangement for mixing an input signal with at least one carrier signal.

Conventional mixer circuits mix or multiply an audio-frequency, digitally encoded baseband signal with a radio-frequency carrier signal. Such mixer circuits should exhibit a high level of linearity, a high level of common-mode rejection in the baseband signal, low noise and the lowest possible power consumption. In addition, it is desirable to be able to operate a mixer circuit over a broad frequency range. In the case of conventional mixer circuits, a distinction is drawn between "single-balanced" and "double-balanced" mixers. When a mixer receives a differential carrier signal (LO signal) while the signal to be mixed is single-ended, this mixer is referred to as "single-balanced". When both the carrier signal and the signal to be mixed are of differential design and are supplied to the mixer in differential form, such a mixer is referred to as a "double-balanced" mixer.

A fundamental drawback of the conventional circuit arrangement is the high power consumption of the mixer circuit for setting the operating point when a resistor is used as a load element. If the quiescent current is too low, common-mode components and hence unwanted nonlinearities in the subsequent amplifier stages arise at a high level of signal modulation on the load resistor. The use of coils as a load element results in a reduction in the quiescent current and in the common-mode components, but means that a larger area is used up and that the transfer characteristic of the mixer circuit is frequency dependent.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
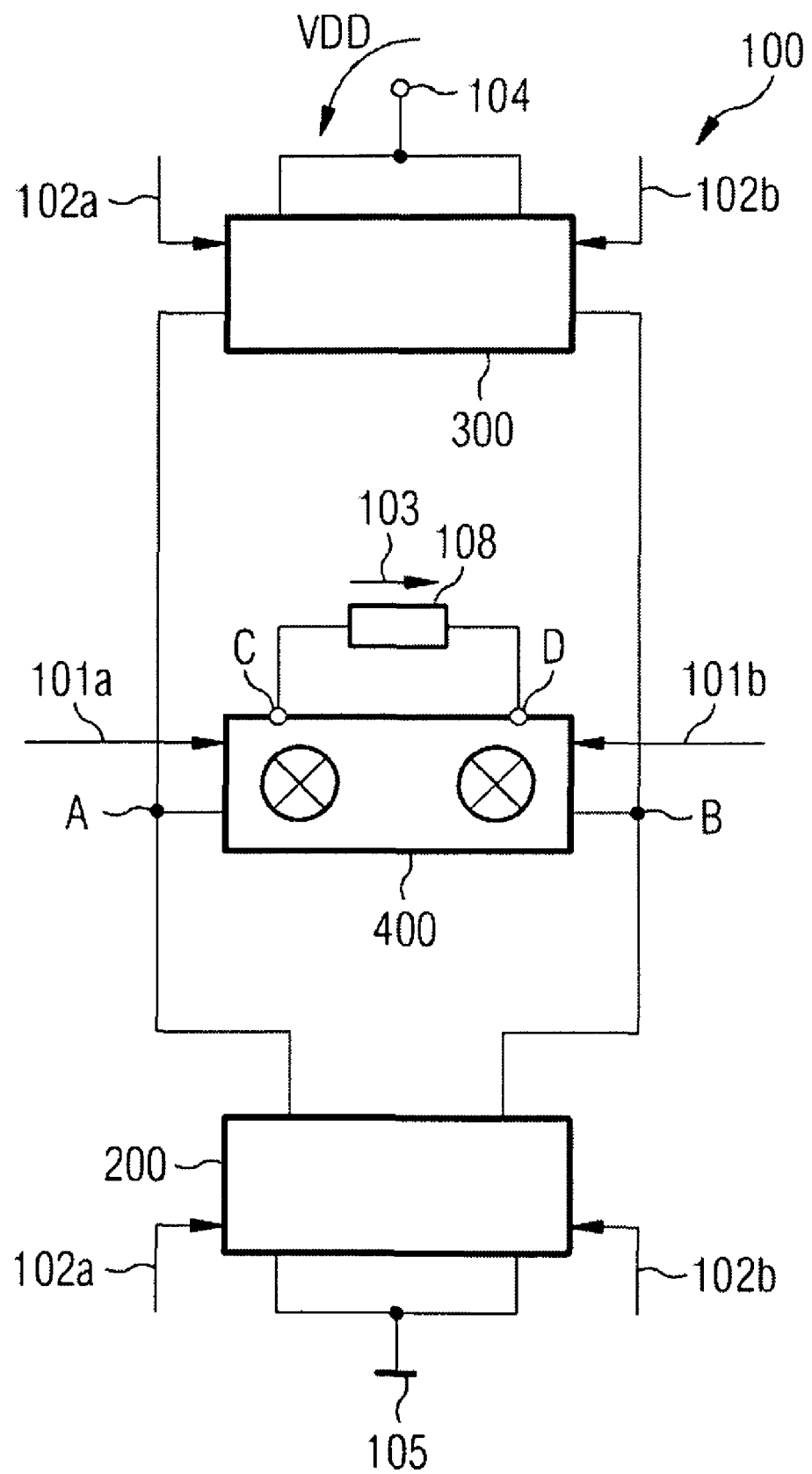
FIG. 1 illustrates one embodiment of a circuit arrangement for mixing an input signal with at least one carrier signal.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

The present invention relates to a circuit arrangement for signal mixing, and relates particularly to a circuit arrangement for mixing an input signal with at least one carrier signal.

One or more embodiments relate to an electronic mixer apparatus which has a mixer core connected to a current source and a current sink, wherein the mixer core is supplied both with at least one carrier signal and with an input signal to be mixed. Both the at least one carrier signal and the input signal to be mixed may be in the form of differential signals. The mixer core has two input connections and two output connections which can be cross-coupled on the basis of the at least one supplied carrier signal.

In one or more embodiments provide a highly linear mixer circuit that exhibits good common-mode rejection in the baseband signal, low noise and a low power consumption.

One embodiment provides a current source arranged so as to mirror a current sink, wherein a mixer core is connected symmetrically between the current source and the current sink. The mixer circuit according to one embodiment includes a current source, a current sink and a multiplier core, which connects the current source and the current sink to the load resistor.

A circuit arrangement according to one embodiment for mixing an input signal with at least one carrier signal includes:

a) a current source, to which the input signal is supplied as a current source input signal and which outputs a signal to be mixed on the basis of the current source input signal;

b) a current sink, to which the input signal is supplied as a current sink input signal and which receives the signal to be mixed on the basis of the current sink input signal; and c) a mixer core which is connected between the current source and the current sink and which has:

c1) mixer input connections for connecting the current sink and the current source; and c2) mixer output connections;

c3) carrier signal input connections for supplying the at least one carrier signal to the mixer core, wherein c4) the mixer core provides cross-coupling between the mixer output connections and the mixer input connections on the basis of the at least one carrier signal.

In addition, a method according to one embodiment for mixing an input signal with at least one carrier signal includes:

a) a signal to be mixed is output from a current source, to which the input signal is supplied as a current source input signal, on the basis of the current source input signal;

b) the signal to be mixed is input into mixer input connections of a mixer core connected to the current source;

c) the signal to be mixed is output from mixer input connections of the mixer core connected to the current source;

d) the signal to be mixed is received by using a current sink, which is connected to the mixer input connections and to which the input signal is supplied as a current sink input signal, on the basis of the current sink input signal; and e) the at least one carrier signal is supplied to the mixer core, connected between the current source and the current sink, via carrier signal input connections of the mixer core, wherein f) the mixer core provides cross-coupling between the mixer output connections and the mixer input connections on the basis of the at least one carrier signal.

In one embodiment, a mixed signal provided by mixing the input signal with the at least one carrier signal can be tapped off between the mixer output connections.

In another embodiment, the first current sink input signal and the second current sink input signal are in the form of a differential signal to be mixed.

In another embodiment, the first current source input signal and the second current source input signal are in the form of a differential signal to be mixed.

In another embodiment, the carrier signal is in the form of a differential signal.

In another embodiment, the mixer core is formed from paired parallel-connected transistors with a complementary transfer characteristic, e.g., NMOS and PMOS transistors or NPN and PNP bipolar transistors.

In another embodiment, the mixer core is formed from transistors having the same transfer characteristic, e.g., NMOS transistors or NPN bipolar transistors.

In another embodiment, the current source has a regulated cascode.

In another embodiment, the current sink has a regulated cascode.

In one embodiment, the regulated cascode is formed from first and second regulating transistors which interact with first and second voltage amplifiers in the form of operational amplifiers.

In another embodiment, different signals to be mixed are output from the current source and are received by the current sink connected to the mixer input connections.

FIG. 1 illustrates a circuit arrangement for a highly linear mixer based on one embodiment. The circuit arrangement illustrated in FIG. 1 contains three components, i.e. a current sink 200, a current source 300 and a mixer core 400. The current sink 200 interacts with the current source 300 via the mixer core 400. A detailed description of the way in which the mixer circuit illustrated in FIG. 1 operates is given below.

The current source 300 is connected to a supply voltage unit 104 which provides a supply voltage potential with respect to ground 105. The current sink 200 is connected to ground 105. The mixer core 400 is connected between the current source 300 and the current sink 200. The mixer core 400 has input connections A, B and output connections C, D.

The output connections C, D have a load resistor 108 connected between them, across which a mixed signal 103 can be tapped off as the output signal. The mixer core 400 provides cross-coupling between the mixer output connections C, D and the mixer input connections A, B on the basis of a supplied carrier signal 101a, 101b (detailed description of the changeover—see FIG. 4). Principle of the cross-coupling between the mixer output connections C, D and the mixer input connections A, B are as follows:

(i) First switching state: The input connection A is connected to the output connection C; and the input connection B is connected to the output connection D; and (ii) Second switching state: The input connection A is connected to the output connection D; and the input connection B is connected to the output connection C.

At the clock rate of the carrier signal 101a, 101b, which may be provided as a differential signal, changeover is effected between the first and second switching states. For the purpose of modulation, a signal to be mixed is multiplied up, i.e. the combination of current sink 200 and current source 300 produces modulation with the current flowing through the mixer core 400 between the mixer connections A and C and B and D (first switching state) and between the connections A and D and the connections B and C (second switching state).

Figure 2:
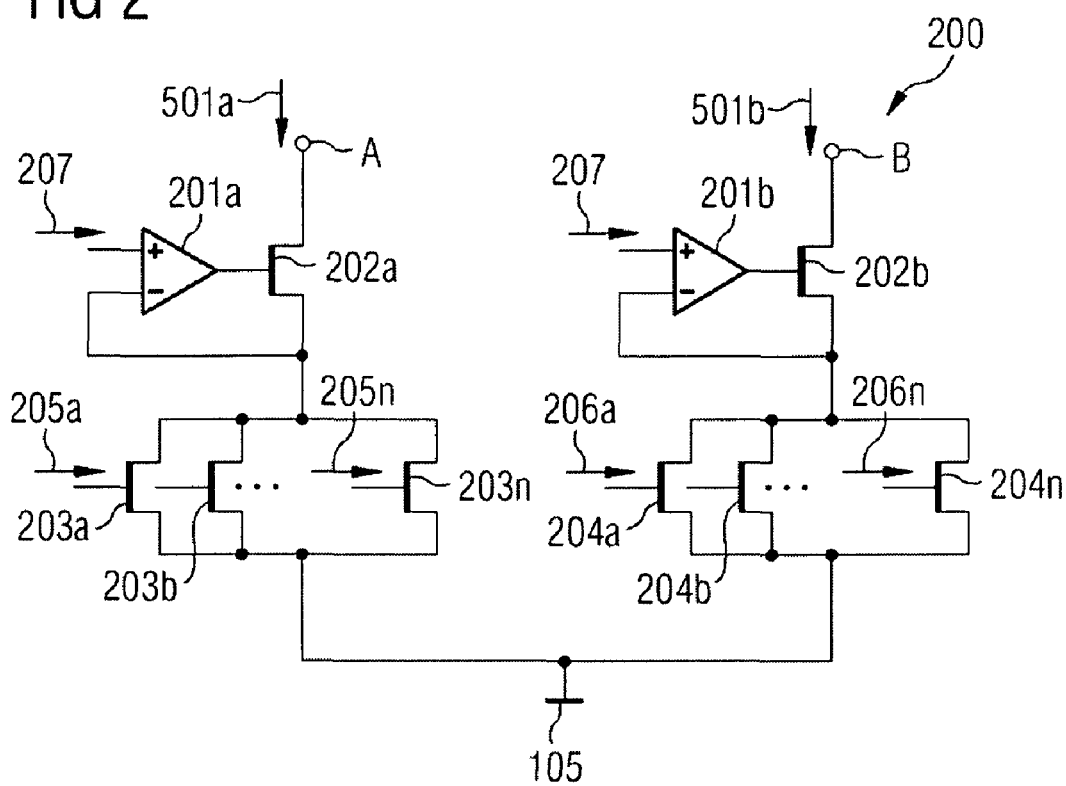
FIG. 2 illustrates one embodiment of a current sink used in the circuit arrangement in FIG. 1 in greater detail.

The current is adjusted using an input signal 102a, 102b, which is in the form of a differential input signal in the example illustrated in FIG. 1. The circuit arrangement 100 illustrated in FIG. 1 therefore allows the carrier signal 101a, 101b to be modulated with or multiplied by the input signal 102a, 102b, producing an appropriate mixed signal 103 on the mixer signal output connections C, D. A detailed description of the current sink 200 illustrated in FIG. 1 is given below with reference to FIG. 2.

The current sink 200 substantially includes switched transistors, i.e. first current sink input transistors 203a-203n and second current sink input transistors 204a-204n. The first and second current sink input transistors are respectively supplied with a first current sink input signal 205a-205n and a second current sink input signal 206a-206n. On the basis of the current sink input signal 203a-203n, 204a-204n, a signal to be mixed 501a, 501b is received in the current sink 200. In addition, the current sink input signal 203a-203n, 204a-204n may be of differential design. Also, the current sink input signal may be digitally encoded.

The circuit nodes A illustrated in FIG. 1 and the parallel-connected first current sink input transistors have a first current sink regulating transistor 202a connected between them which uses a current sink control signal and a first current sink amplifier to contribute to optimizing a degree of linearity for the entire current source.

In one embodiment, the first and second current sink regulating transistors form cascode transistors which respectively interact with the first and second current sink amplifiers 201a, 201b in the form of operational amplifiers. The circuit arrangement, respectively include the first and second current sink amplifiers 201a, 201b and the first and second current sink regulating transistors 202a, 202b, together form a regulated cascode.

Figure 3:
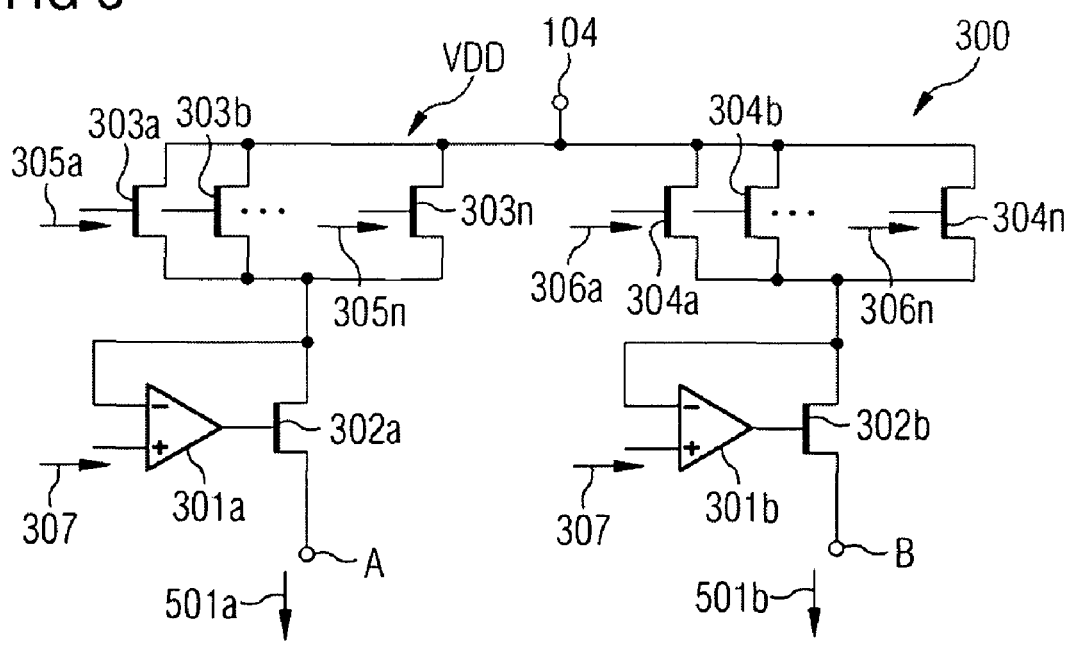
FIG. 3 illustrates one embodiment of a current source used in the circuit arrangement in FIG. 1 in greater detail.

FIG. 3 illustrates the current source 300 illustrated in block diagram form in FIG. 1 in greater detail. It should be pointed out that the current source 300 illustrated in FIG. 3 is designed so as to symmetrically mirror the current sink 200 illustrated in FIG. 2.

In one embodiment, the current source 300 is connected between the supply voltage unit 104 and the two mixer input connections A, B. The current source 300, like the current sink 200, has switched transistors and regulated cascodes. A flow of current is provided from the supply voltage unit 104, which provides a supply voltage potential Vdd with respect to ground 105, to the circuit node A, B. In this case, the input signal 102a, 102b is respectively supplied to the current source 300 as a differential current source input signal, i.e. first current source input transistors 302a-302n are supplied with a first current source input signal 305a-305n, while second current source input transistors 304a-304n are supplied with a second current source input signal 306a-306n.

It should be pointed out that the current source input signal 305a-305n, 306a-306n may be in the form of a differential current source input signal. In addition, the current source input signal may be digitally encoded.

As described above with reference to FIG. 2 for the current sink 200, a regulated cascode is also provided for the current source 300. The regulated cascode includes a first current source amplifier 301a, which, as illustrated in FIG. 3, is connected up to a first current source regulating transistor 302a, and a second current source amplifier 301b, which, as illustrated in FIG. 7, is connected up to a second current source regulating transistor 302b. The first and second current source amplifiers 301a, 301b are respectively supplied with a current source control signal 307. The regulated cascodes ensure that a high level of linearity is maintained.

Figure 4:
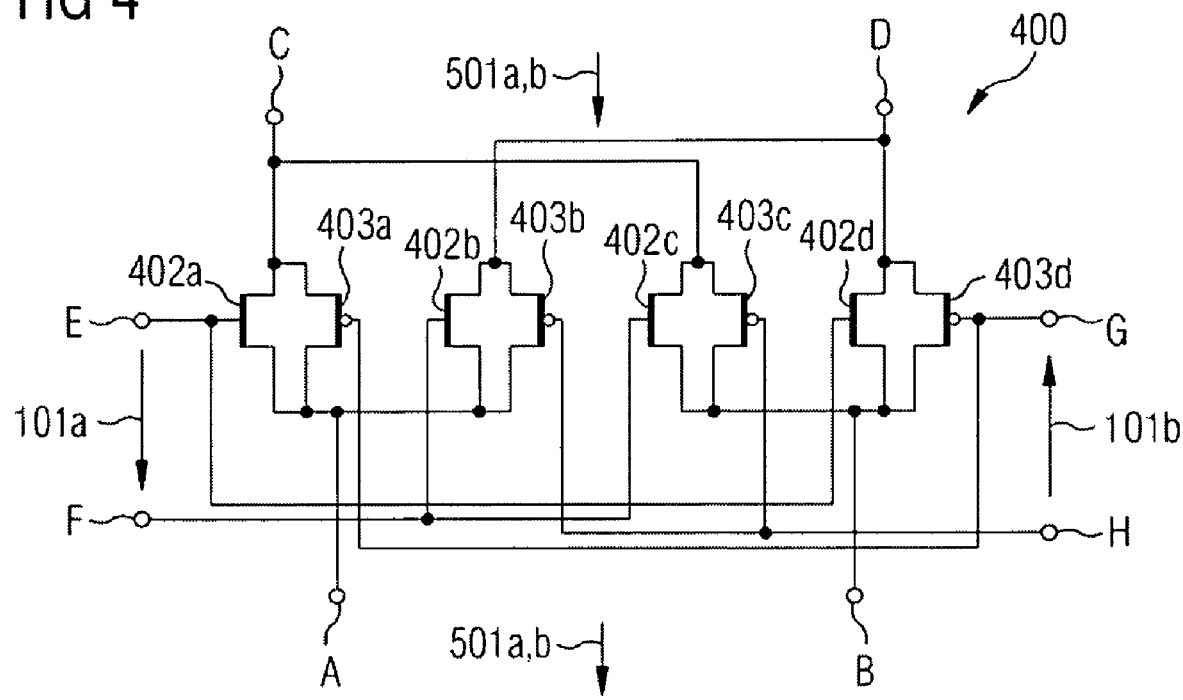
FIG. 4 illustrates one embodiment of a mixer core used in the circuit arrangement in FIG. 1 in greater detail.
Figure 5:
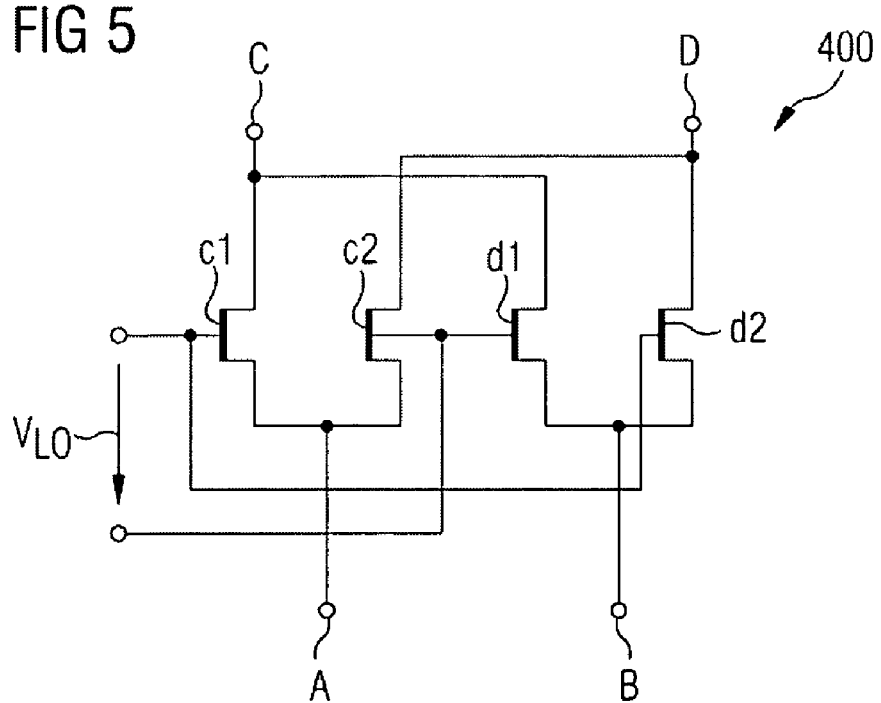
FIG. 5 illustrates a detailed circuit design for a further mixer core which may be used in FIG. 1.

FIG. 4 illustrates the mixer core 400 explained in FIG. 5 in greater detail. The mixer core 400 contains the first mixer transistors 402a, 402b, 402c and 402d, which may be in the form of NMOS transistors, for example, and the second mixer transistors 403a, 403b, 403c and 403d, which may be in the form of PMOS transistors, for example. The circuit arrangement illustrated in FIG. 8 is used to connect a differential signal to be mixed 501a, 501b, which is applied to the inputs, i.e. the circuit nodes A and B, to the mixer output connections C, D by dint of cross-coupling, on the basis of the applied carrier signal 101a, 101b, which is respectively provided on carrier signal input connections E, F and G, H.

The differential form of the carrier signal 101a-101b allows cross-coupling to be provided as above in points (i) (first switching state) and (ii) (second switching state). In the first switching state, in which firstly the mixer input connection A is connected to the mixer output connection C and secondly the mixer input connection B is connected to the mixer output connection D, firstly the first mixer transistor 402a and the second mixer transistor 403a and secondly the first mixer transistor 402d and the second mixer transistor 403d are on.

In the other state, i.e. the second switching state (see (ii) above), the first mixer transistor 402b and the second mixer transistor 403b are on and the first mixer transistor 402c and the second mixer transistor 403c are on. The mixer input connections A, B are therefore cross-coupled to the mixer output connections C, D at the clock rate of the carrier signal 101a, 101b.

FIG. 5 illustrates a further mixer core 400 which can be used in FIG. 1. The mixer core 400 is designed using two transistor pairs c1, c2 and d1, d2 having the same transfer characteristic. The gate connections are actuated using a radio-frequency carrier signal $V_{LO}$. On the basis of the radio-frequency carrier signal $V_{LO}$, a current flows from the inputs C and D via cross-coupling to the outputs A and B.

Figure 6:
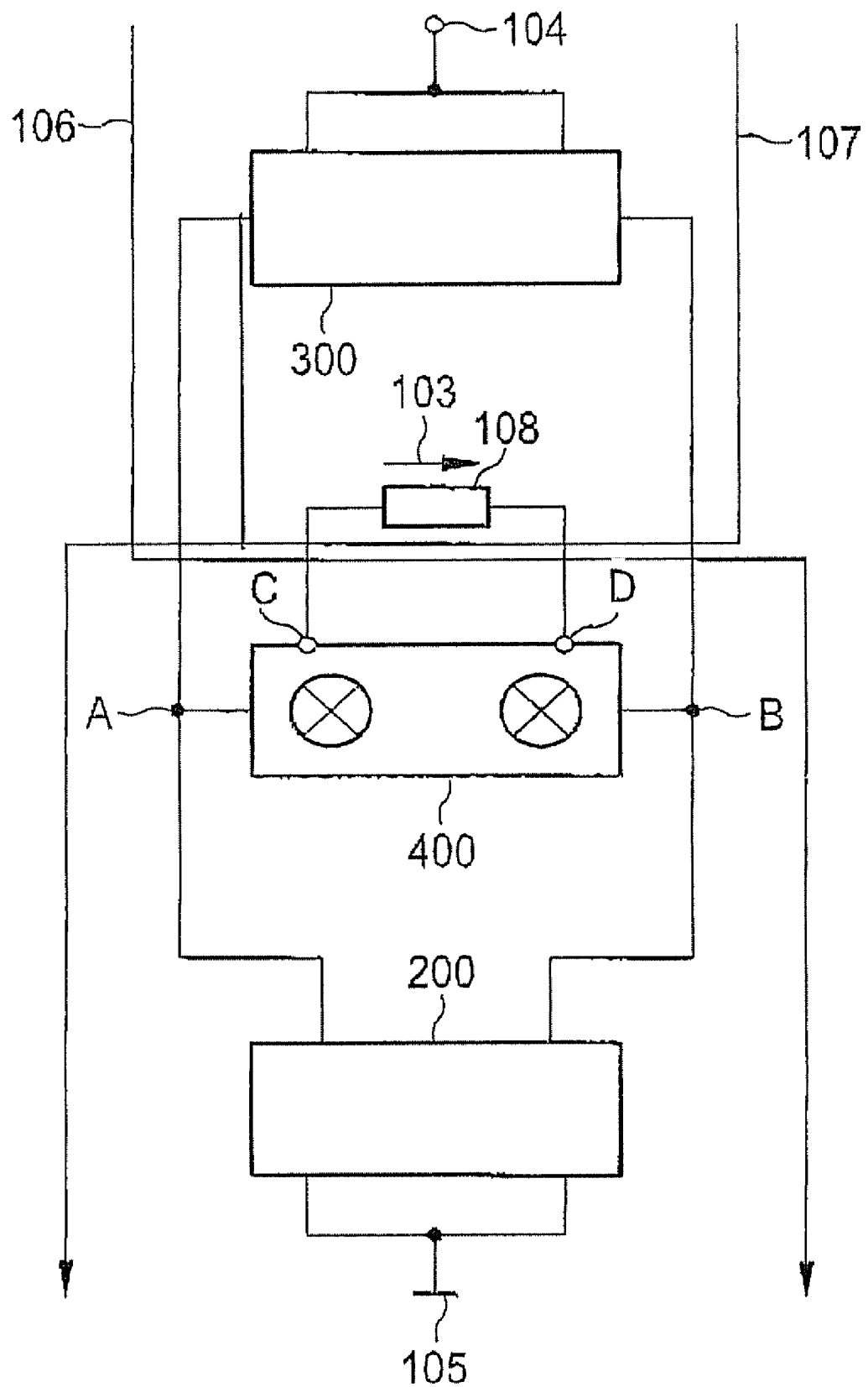
FIG. 6 illustrates the circuit arrangement illustrated in FIG. 1, with a detailed illustration of first and second directions of current flow caused by the cross-coupling in the mixer core.

FIG. 6 illustrates a block diagram of a mixer circuit based on one embodiment, wherein the block diagram illustrated in FIG. 6 corresponds to the block diagram illustrated in FIG. 1, with the difference that in FIG. 6 first and second directions of current flow 106 and 107 are additionally indicated in detail. The reference symbols 106 and 107 denote arrows which identify the direction of current flow from the current source 300 to the current sink 200. A more detailed explanation of the current flow, which is characterized by the first direction of current flow 106 and the second direction of current flow 107, is given below. With positive actuation, the first current source input transistors 303a-303n of the current source 300 (see FIG. 3) produce a flow of current from the supply voltage unit 104 to the circuit node A.

In the first switching state, the current flows onward from the circuit node A to the circuit node C (FIG. 4) and onward via the load resistor 108 (FIG. 1) and the connection D-B to the circuit node B, wherein the second current sink input transistors 204a-204n are on and route a flow of current to ground 105. This flow of current, i.e. the flow of current in the first switching state, corresponds to the first direction of current flow 106 illustrated in FIG. 6. Hence, the second current source input transistors 304a-304n produce a flow of current from the supply voltage unit 104 to the circuit node B.

By dint of the cross-coupling, the current flows from the circuit node B to the circuit node D (FIG. 4) and onward via the load resistor 108 (FIG. 1, FIG. 6) to the circuit node C. In this case, the cross-coupling has a connection from the circuit node C to the circuit node A. This circuit node A is connected to ground 105 by using the first current sink input transistors 203a-203n, which means that the flow of current is routed onward to ground. The flow of current therefore follows the second direction of current flow indicated by the reference symbol 107.

In the second switching state (see point (ii) above), the direction of current flow through the load transistor 108 changes, so that a differential output signal is obtained. With the circuit arrangement, the current sink 200 and the current source 300 include switched single transistors and a regulated cascode. At the respective drain node of the switching transistors, the regulated cascode produces a potential which is independent of the input signal. In this way, all input transistors which are on produce an identical current delta through the cascode transistor, i.e. the first and second current sink regulating transistors 202a-202b and the first and second current source regulating transistors 302a-302b. The effect achieved by this is that the current source 300 and the current sink 200 respectively have a linear transfer characteristic.

In addition, as illustrated in FIG. 4, parallel connection of transistors with a complementary transfer characteristic, such as the parallel connection of NMOS and PMOS transistors, allows implementation of a switching resistance which is extremely low and independent of the modulation. This results in steep turn-on edges and hence in a linear transfer characteristic for the mixer core (multiplier core) 400.

With the circuit arrangement according to one or more embodiments, the load resistor 108 can be deflected symmetrically about a center potential (for example Vdd/2) without the need for a quiescent current potential. This results in low power consumption, since a flow of current needs to be provided only for actuation.

This property is advantageous for systems with a high crest factor, the crest factor denoting the ratio of peak value to average value for a sinusoidal voltage. By way of example, a high crest factor occurs in systems such as WLAN, WiMAX, DVB-H, in which the transmission signal is formed by superimposing many sinusoidal oscillations, denoted as an OFDM method, for example. Overall, reducing common-mode components and increasing the magnitude of the modulation range at a low supply voltage do not require provision of inductances connected in parallel with a load resistor, as in the prior art. This results in a wide useable frequency range and little area used up.

The mixer circuit according to one embodiment has almost no common-mode component. Over a wide range, the transfer characteristic is independent of frequency. A further advantage is that no demands are placed on the matching behavior of the load impedance 108. The linearity of the mixer circuit according to the invention is limited (in the case of an ideal LO signal) only by the matching behavior of the switching transistors, i.e. the first and second current sink input transistors 203a-203n, 204a-204n and the first and second current source input transistors 304a-304n, 305a-305n.

One further advantage of the circuit arrangement according to one embodiment is that the voltage drop across the current source 300 or the current sink 200 is very low. It is typically between 0.2 V and 0.3 V. Even at a low supply voltage of, by way of example, 1.5 V, the mixer circuit allows a large deflection of up to 1.0 V peak differential.

Although the present invention has been described above with reference to exemplary embodiments, it is not limited thereto, but rather may be modified in a wide variety of ways.

The invention is also not limited to the cited application options. For example, the circuit arrangement may be operated as a digital polar modulator or as a digital vector modulator.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit arrangement comprising:
   a current source;
   a current sink; and
   a mixer core coupled between the current source and the current sink comprising:
      mixer input connections for coupling the current sink and the current source; and
      mixer output connections; and
      carrier signal inputs configured for supplying at least one carrier signal to the mixer core, and
      wherein the mixer core provides cross-coupling between the mixer output connections and the mixer input connections on the basis of the at least one carrier signal, and
      wherein a first current sink input signal and a second current sink input signal are in the form of a differential signal to be mixed and a first current source input signal and a second current source input signal are input to the current source in the form of a differential signal to be mixed.

2. The circuit arrangement of claim 1, wherein a mixed signal provided by mixing an input signal with the at least one carrier signal is tapped off between the mixer output connections.

3. The circuit arrangement of claim 1, comprising first and second current sink input transistors supplied with the first current sink input signal and the second current sink input signal.

4. The circuit arrangement of claim 1, comprising first and second current source input transistors supplied with the first current source input signal and the second current source input signal.

5. The circuit arrangement of claim 1, wherein the at least one carrier signal is a differential signal.

6. A circuit arrangement for mixing an input signal with at least one carrier signal, comprising:
   a current source, to which the input signal is supplied as a current source input signal and which outputs a signal to be mixed on the basis of the current source input signal;
   a current sink, to which the input signal is supplied as a current sink input signal and which receives the signal to be mixed on the basis of the current sink input signal; and
   a mixer core which is connected between the current source and the current sink and which has:
      mixer input connections for connecting the current sink and the current source; and
      mixer output connections;
      carrier signal input connections for supplying the at least one carrier signal to the mixer core,
      wherein the mixer core provides cross-coupling between the mixer output connections and the mixer input connections on the basis of the at least one carrier signal.

7. The circuit arrangement of claim 6, wherein a mixed signal provided by mixing the input signal with the at least one carrier signal can be tapped off between the mixer output connections.

8. The circuit arrangement of claim 6, wherein the current sink input signal comprises a first and a second current sink input signal, and the first current sink input signal and the second current sink input signal are in the form of a differential signal to be mixed.

9. The circuit arrangement of claim 6, wherein the current source input signal comprises a first and a second current source input signal, and the first current source input signal and the second current source input signal are in the form of a differential signal to be mixed.

10. The circuit arrangement of claim 6, wherein the carrier signal is in the form of a differential signal.

11. The circuit arrangement of claim 6, wherein the mixer core is formed from paired parallel-connected transistors with a complementary transfer characteristic.

12. The circuit arrangement of claim 6, wherein the mixer core is formed with transistors having the same transfer characteristic.

13. The circuit arrangement of claim 6, wherein the current source has a regulated cascode.

14. The circuit arrangement of claim 6, wherein the current sink has a regulated cascode.

15. The circuit arrangement of claim 6, wherein, for at least one element selected from the group consisting of the current source and the current sink, a regulated cascode is formed from first and second regulating transistors which interact with first and second voltage amplifiers in the form of operational amplifiers.

16. The circuit arrangement of claim 6, wherein the mixer output connections have a load resistor connected to them for transferring the signal to be mixed.

17. A method for mixing an input signal with at least one carrier signal, comprising:
   outputting a signal to be mixed from a current source, to which the input signal is supplied as a current source input signal, on the basis of the current source input signal;
   inputting the signal to be mixed into mixer input connections of a mixer core connected to the current source;
   outputting the signal to be mixed from mixer input connections of the mixer core connected to the current source;
   receiving the signal to be mixed using a current sink, connected to the mixer input connections and to which the input signal is supplied as a current sink input signal, on the basis of the current sink input signal; and supplying the at least one carrier signal to the mixer core, connected between the current source and the current sink, via carrier signal input connections of the mixer core, wherein the mixer core provides cross-coupling between the mixer output connections and the mixer input connections on the basis of the at least one carrier signal.

18. The method of claim 17, comprising outputting different signals to be mixed from the current source and receiving the different signals by the current sink connected to the mixer input connections.

19. The method of claim 17, comprising obtaining a mixed signal by mixing the input signal with the at least one carrier signal between the mixer output connections.

20. The method of claim 17, comprising inputting the first current sink input signal and the second current sink input signal as a differential signal to be mixed.

21. The method of claim 17, comprising inputting the first current source input signal and the second current source input signal as a differential signal to be mixed.

22. The method of claim 17, comprising inputting the at least one carrier signal as a differential signal.

23. The method of claim 17, wherein the current source has a regulated cascode circuit.

24. The method of claim 17, wherein the current sink has a regulated cascode circuit.

25. The method of claim 17, comprising routing the signal to be mixed through a load resistor connected to mixer output connections of the mixer core.

* * * * *